(12) United States Patent
Wang et al.

(10) Patent No.: US 10,707,998 B2
(45) Date of Patent: Jul. 7, 2020

(54) METHODS, SYSTEM AND USER EQUIPMENT OF A WIRELESS COMMUNICATION NETWORK FOR DETERMINING TRANSMISSION CONDITIONS FOR A REAL-TIME MEDIA FLOW

(71) Applicant: Telefonaktiebolaget LM Ericsson (publ), Stockholm (SE)

(72) Inventors: Ying Wang, Stockholm (SE); Jing Fu, Solna (SE); Liping Wang, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 66 days.

(21) Appl. No.: 16/070,404

(22) PCT Filed: Jan. 20, 2016

(86) PCT No.: PCT/SE2016/050033
§ 371 (c)(1),
(2) Date: Jul. 16, 2018

(87) PCT Pub. No.: WO2017/127000
PCT Pub. Date: Jul. 27, 2017

(65) Prior Publication Data
US 2019/0028231 A1 Jan. 24, 2019

(51) Int. Cl.
*H04L 1/00* (2006.01)
*H04W 28/02* (2009.01)
(Continued)

(52) U.S. Cl.
CPC .......... *H04L 1/009* (2013.01); *H03M 13/353* (2013.01); *H03M 13/356* (2013.01);
(Continued)

(58) Field of Classification Search
None
See application file for complete search history.

(56) References Cited

U.S. PATENT DOCUMENTS

| 5,461,639 A | * | 10/1995 | Wheatley, III | ........ H03M 13/23 370/342 |
| 2003/0231105 A1 | * | 12/2003 | Kim | ..................... G06K 7/0008 340/10.2 |

(Continued)

FOREIGN PATENT DOCUMENTS

| WO | WO 2013/098810 A1 | 7/2013 |
| WO | WO 2015/069164 A1 | 5/2015 |

OTHER PUBLICATIONS

Notification of Transmittal of the International Search Report and the Written Opinion of the International Searching Authority for International Application No. PCT/SE2016/050033 dated Sep. 22, 2016.

*Primary Examiner* — Mujtaba M Chaudry
(74) *Attorney, Agent, or Firm* — Sage Patent Group

(57) ABSTRACT

Disclosed is a method performed by a system of a wireless communication network for determining transmission conditions for a real-time media flow to be transmitted wirelessly to a first User Equipment, UE, residing in a first cell served by a first base station of the network. The method comprises obtaining radio network statistics of the first cell, the radio network statistics comprising radio network data for individual of a plurality of UEs in the first cell, UE throughput for individual of the plurality of UEs, and UE packet loss or packet delay for individual of the plurality of UEs, and obtaining, at a second time point occurring later in time than the obtaining of the radio network statistics, radio network data for the first UE. The method further comprises determining a predicted first UE throughput and a predicted first UE packet loss or packet delay based on the obtained (Continued)

radio network statistics of the first cell and on the obtained radio network data for the first UE, and triggering sending of information of the predicted first UE throughput and of the predicted first UE packet loss or excessive packet delay to a sender of the real-time media flow to the first UE. A Forward Error Correction, FEC, optimization module takes the predicted UE packet loss rate, the predicted UE throughput, and adapts the amount of FEC redundancy packets according to the throughput and packet loss rate. Further, the adapted amount of FEC redundancy packets are then used by the sender of the video when transmitting the video.

13 Claims, 7 Drawing Sheets

(51) Int. Cl.
*H04L 1/18* (2006.01)
*H04W 28/10* (2009.01)
*H03M 13/35* (2006.01)
*H04L 29/06* (2006.01)

(52) U.S. Cl.
CPC .......... *H04L 1/0041* (2013.01); *H04L 1/0045* (2013.01); *H04L 1/1877* (2013.01); *H04L 65/607* (2013.01); *H04W 28/0231* (2013.01); *H04W 28/0252* (2013.01); *H04W 28/0268* (2013.01); *H04W 28/10* (2013.01)

(56) References Cited

U.S. PATENT DOCUMENTS

| | | | |
|---|---|---|---|
| 2004/0236547 A1* | 11/2004 | Rappaport | G06F 17/509 703/2 |
| 2005/0123059 A1* | 6/2005 | Harris | H04W 52/20 375/244 |
| 2005/0138671 A1* | 6/2005 | Love | H04H 60/11 725/123 |
| 2007/0286102 A1* | 12/2007 | Shimokawa | H04W 74/08 370/310 |
| 2009/0003236 A1 | 1/2009 | Aoyama et al. | |
| 2012/0282942 A1* | 11/2012 | Uusitalo | H04W 16/14 455/452.2 |
| 2013/0163455 A1 | 6/2013 | Oguchi | |

* cited by examiner

METHODS, SYSTEM AND USER EQUIPMENT OF A WIRELESS COMMUNICATION NETWORK FOR DETERMINING TRANSMISSION CONDITIONS FOR A REAL-TIME MEDIA FLOW

CROSS REFERENCE TO RELATED APPLICATION

This application is a 35 U.S.C. § 371 national stage application of PCT International Application No. PCT/SE2016/050033, filed on Jan. 20, 2016, the disclosure and content of which is incorporated by reference herein in its entirety.

TECHNICAL FIELD

The present disclosure relates generally to methods, computer programs, User Equipments, UEs, and systems of a wireless communication network for determining transmission conditions for a real-time media flow to be transmitted wirelessly to a first UE.

BACKGROUND

In real-time media streaming services, such as video streaming, it is important that the media stream arrives to the receivers that is to consume the media in time and without errors. However, for wireless networks, the higher transmission error rate to a wireless receiver, i.e. a wireless UE, generates much higher packet loss compared to a wired receiver. This data loss in transmission causes more degradation to a video stream than an audio stream due to the temporal dependency in video data.

Due to the real-time nature of many multimedia applications, using retransmission to recover from an error usually does not meet the time requirement. As a result, Forward Error Correction, FEC, is naturally used to protect real-time multimedia data. The idea of FEC is to transmit additional redundant information along with the data that need to be protected. In case some packets got lost, these redundant FEC packets can be used by the receiver to recover the lost or corrupted data.

In the following it is briefly described how Internet Protocol/User Datagram Protocol, IP/UDP packet losses occur in Long Term Evolution, LTE, networks. First, IP packets are segmented to smaller Radio Link Control, RLC, packets in the RLC layer, and then the RLC packets are in turn segmented to transport blocks in the Media Access Control, MAC layer. In the MAC layer, a stop-and-wait Hybrid Automatic Repeat Request, HARQ, mechanism is applied to perform retransmissions of the erroneous transport blocks and to correct the majority of transmission errors happened at the air interface. In general, the targeted block error rate, BLER, for initial transmission is set around 10%, which suggest 10% of initial HARQ transmissions over the air interface will be erroneous. In HARQ, there are parameters for controlling the maximum number of retransmission attempts. When the number of retransmission attempts reaches the maximum number, the transport block is considered to be lost in the MAC layer. The default value for retransmission is 3, which signifies that the each transport block has a 0.1% loss probability if we assume uncorrelated transport block loss and the same BLER for the initial transmission and the retransmissions. However, these losses could be highly correlated.

In the RLC layer, a highly reliable sliding window-based ARQ mechanism can be applied to further reduce the packet loss. There are three different RLC modes: Transparent Mode, TM, Unacknowledged Mode, UM and Acknowledged Mode, AM. TM signifies that the RLC layer is completely transparent. UM and AM both contain segmentation/reassembly functions and in-sequence delivery functions. The difference is that there are retransmissions in the AM mode whereas no retransmissions in the UM mode. The RLC packet loss rate not only depends on packet loss rate in the MAC layer, but also on its mode and settings such as RLC window size, reordering timer, and maximum allowed retransmissions. Usually, worse radio channel condition means more retransmission attempts, further resulting in longer delay, higher packet loss probability and lower throughput.

For real-time communication, RLC is usually configured to Unacknowledged Mode, which suggests no retransmissions. Therefore, RLC and MAC layer packet loss should be in similar ranges. With RLC retransmission RLC packet loss should be much lower than RLC and MAC layer packet loss. Finally, there are segmentations to take account when considering IP packet loss. When an IP packet loss is segmented to for example 10 transport blocks in MAC layer, a single transport block loss will lead to whole packet loss. This will increase the IP packet loss rate compared to RLC and MAC loss rate, especially when RLC does not use retransmissions. The exact number of segments to be divided into depends on a lot of parameters, including IP packet size, cell capacity, number of users in cell, radio quality, and the scheduler, etc. This makes IP packet loss rate hard to compute.

Since the redundant packets take extra amount of network resources, a static FEC will cause a lot of overhead when the error rate is low. To address this, adaptive FEC has been proposed. An adaptive FEC will increase or decrease the amount of redundant packets when the packet loss rate is getting higher or lower, respectively. In this way, adaptive FEC can get better balance between bandwidth and Quality of Experience, QoE. Using adaptive FEC for video applications in wireless networks has been an active research area. All adaptive FECs require information to estimate current/future available network bandwidth and packet loss; and decide redundancy rate based on the information. One approach is to estimate the network condition on the receiver side and send feedback to the sender by using a RTCP message, such as described in WO 2013098810.

The network conditions for a UE in a mobile communication network, e.g. LTE network, change all the time, as a result of several reasons. First of all, the UE may move around and may have better or worse link quality depending on the distance to the serving cell. Secondly, even if the UE is stationary, the radio quality could change over time as objects in the environment move. Third, the number of active UEs in a cell may change and result in changed link condition. Finally, the UE may be handed over to another cell, with different number of active users, and different radio qualities, and different cell configurations, thus resulting in changed network conditions.

In some existing solutions, as in e.g. WO2013098810, the receiver of the video flow monitors network conditions such as the loss rate and continually reports this back to the sender. Thus, the sender can adapt the redundancy rate based on the feedback from the receiver. This approach works well when the network conditions do not change much over time. However, in a mobile wireless network, a receiving UE's link quality can change more rapidly and frequently comparing to wired network, which makes the receiver reports based on the past network condition do not work well in real time. The main reason is that the response time for this kind of FEC is a bit slow, as the adaptation of video bitrate and FEC at the sender needs to wait for the response from the receiver after some transmissions. Especially in the case when video is getting started, the sender has no idea about what rate and FEC that should be used. In addition, this kind of end user based packet loss prediction is not as accurate as network based, as it knows much little about the situation in the network.

SUMMARY

As shown above there is a need for a good prediction of how a wireless communication network may behave in the near future so as to be able to select transmission rate and error correction, e.g. FEC redundancy rate, for a media stream that is to be sent in the network.

It is an object of at least some embodiments of the invention to address at least some of the problems and issues outlined above. It is another object to make it possible to select a proper sending rate and error correction for real-time media to be sent to a UE wirelessly connected to a wireless communication network. It is possible to achieve these objects and possibly others by using a method and an apparatus as defined in the attached independent claims.

According to one aspect, a method is provided performed by a system of a wireless communication network for determining transmission conditions for a real-time media flow to be transmitted wirelessly to a first UE residing in a first cell served by a first base station of the network. The method comprises obtaining radio network statistics of the first cell, the radio network statistics comprising radio network data for individual of a plurality of UEs in the first cell, UE throughput for individual of the plurality of UEs, and UE packet loss for individual of the plurality of UEs, and obtaining, at a second time point occurring later in time than the obtaining of the radio network statistics, radio network data for the first UE. The method further comprises determining a predicted first UE throughput and a predicted first UE packet loss based on the obtained radio network statistics of the first cell and on the obtained radio network data for the first UE, and triggering sending of information of the predicted first UE throughput and of the predicted first UE packet loss to a sender of the real-time media flow to the first UE.

According to another aspect, a method is provided performed by a UE wirelessly connected to a wireless communication network for facilitating transmission of a real-time media flow from a sender towards the UE. The method comprises sending a request to the network, requesting a packet loss prediction and a throughput prediction for transmission of a real-time media flow from the network towards the UE, and receiving, from the network, information of a predicted UE throughput and a predicted UE packet loss predicted by the network in response to the sent request.

According to another aspect, a system is provided operable in a wireless communication network, configured for determining transmission conditions for a real-time media flow to be transmitted wirelessly to a first UE residing in a first cell served by a first base station of the network. The system comprises a processor and a memory. The memory contains instructions executable by said processor, whereby the system is operative for obtaining radio network statistics of the first cell, the radio network statistics comprising radio network data for individual of a plurality of UEs in the first cell, UE throughput for individual of the plurality of UEs, and UE packet loss for individual of the plurality of UEs, and obtaining, at a second time point occurring later in time than the obtaining of the radio network statistics, radio network data for the first UE. The system is further operative for determining a predicted first UE throughput and a predicted first UE packet loss based on the obtained radio network statistics of the first cell and on the obtained radio network data for the first UE, and triggering sending of information of the predicted first UE throughput and of the predicted first UE packet loss to a sender of the real-time media flow to the first UE.

According to another aspect, a UE is provided operable to be wirelessly connected to a wireless communication network for facilitating transmission of a real-time media flow from a sender towards the UE. The UE comprises a processor and a memory. The memory contains instructions executable by said processor, whereby the UE is operative for sending a request to the network, requesting a packet loss prediction and a throughput prediction for transmission of a real-time media flow from the network towards the UE, and receiving, from the network, information of a predicted UE throughput and a predicted UE packet loss predicted by the network in response to the sent request.

By such methods, systems and UEs, a good prediction of wireless network conditions is achieved, which predicted network conditions are provided to a sender of a media flow so as to select suitable sending rate and error correction for the real-time media to be sent to a UE wirelessly connected to the network.

According to other aspects, computer programs and carriers are also provided, the details of which will be described in the claims and the detailed description.

Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Figure 1:
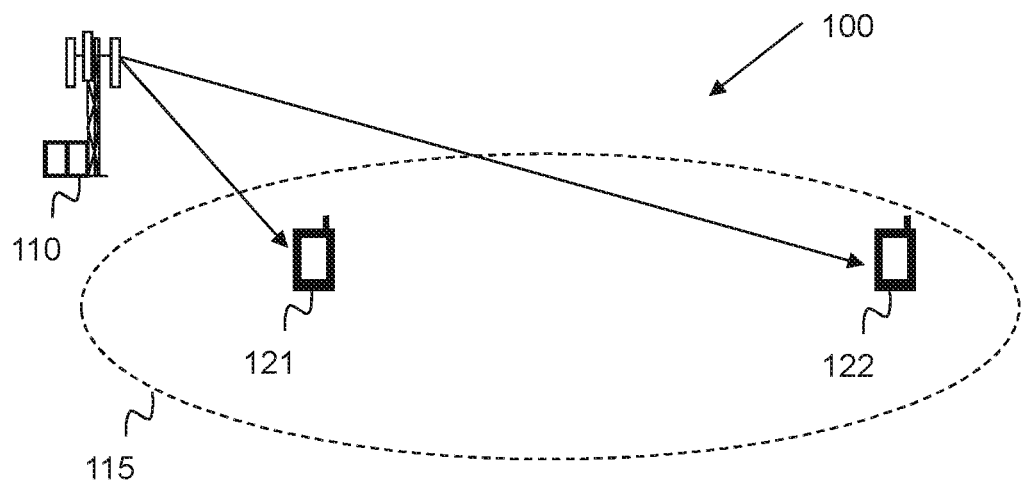
FIG. 1 is a communication scenario illustrating a base station and two UEs being served by the base station of a communication network, according to the prior art.

FIG. 1 shows a wireless communication network 100 comprising a network node, e.g. a base station 110 that provides radio coverage in a geographical area called a cell 115. Within the cell 115 there is in this exemplary network 110 located a first UE 121 and a second UE 122 that are wirelessly connected to the base station 110. The UEs may be any kind of wireless device that can communicate wirelessly to a base station of a wireless communication network.

Figure 2:
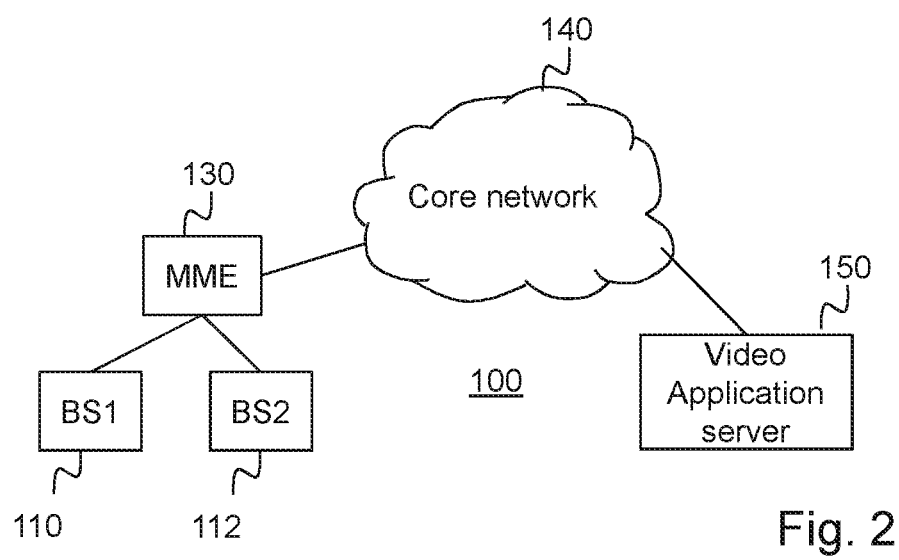
FIG. 2 is a schematic block diagram illustrating a communication network according to prior art.

FIG. 2 shows how the base station 110 in FIG. 1 are connected higher up in the communication network 100. In this example, the communication network 100 is a Long Term Evolution, LTE, network, wherein the base station 110 as well as a second base station 112 are connected to a Mobility Management Entity, MME 130. In an alternative, they may be connected to different MMEs. Further, the MME 130 is connected to a core network 140. Also, a video application server 150 may be connected to the core network. Apart from in LTE networks, the invention is also applicable in other wireless communication networks, such as for example in Global System for Mobile communication, GSM, Third Generation, 3G, Wideband Code Division Multiple Access, W-CDMA, CDMA2000, evolutions of LTE etc.

Figure 3:
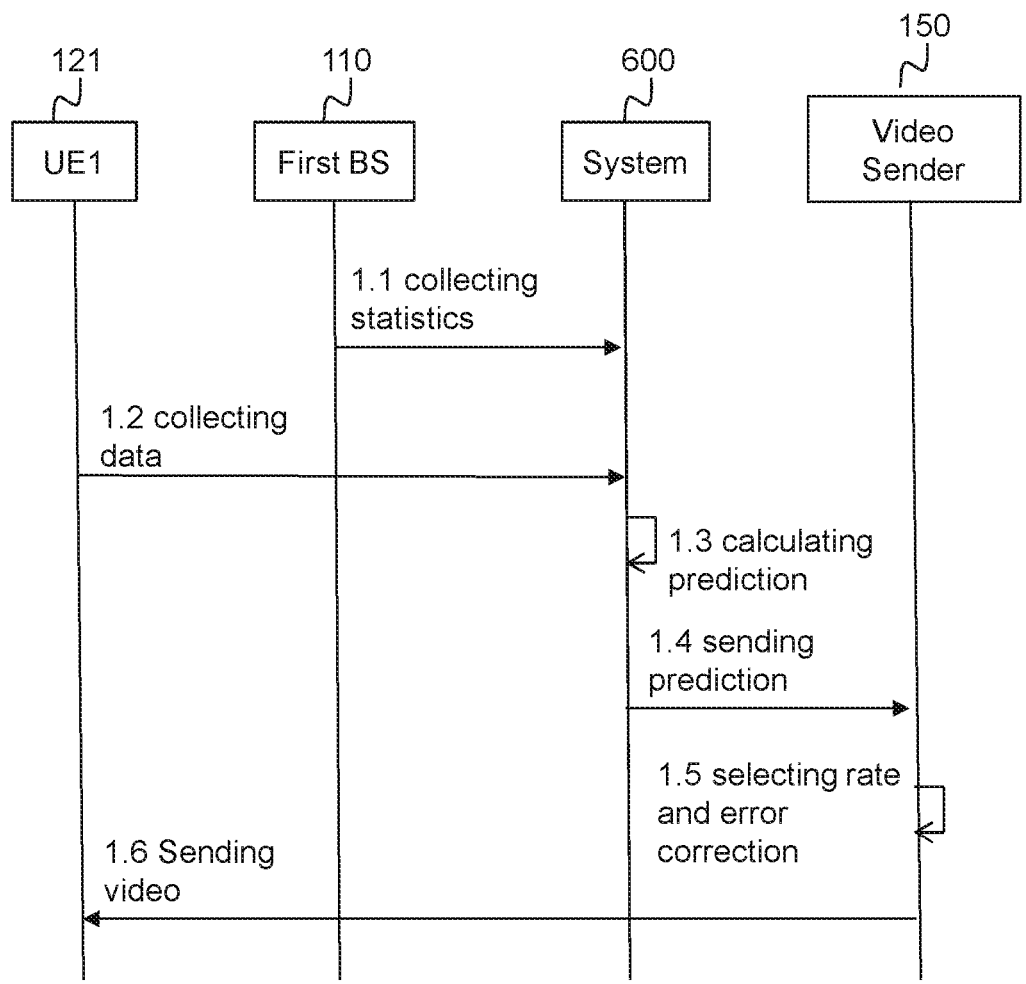
FIG. 3 is a signaling diagram illustrating an embodiment.

FIG. 3 illustrates an embodiment of the invention. In this embodiment, a solution is provided that will make it possible to select a suitable sending rate and error correction for real-time media, e.g. video, to be sent to a UE 121 wirelessly connected to a wireless communication network. This is achieved by collecting 1.1, at a system 600 of a wireless communication network, radio network statistics from a first base station 110 providing radio coverage to a first cell, the radio network statistics comprising radio network data, throughput and packet loss for a plurality of UEs that are in the first cell. The statistics are stored. The statistics may be collected for UEs in the first cell that are receiving, or have received, video in the first cell. Then when a first UE 121 residing in the first cell at a later time point is to receive video, its radio network data is collected 1.2. The collected statistics for the plurality of UEs are then used to calculate 1.3, at the system, a prediction of throughput and packet loss for the first UE. The calculation may be performed by a machine-learning method. The calculated predictions of throughput and packet loss for the first UE are then sent 1.4 to the sender of the real-time media that selects 1.5 a suitable sending rate and a suitable error correction according to the predicted throughput and packet loss and thereafter sends 1.6 real-time media, e.g. video to the first UE 121 according to the selected rate and error correction.

Figure 4:
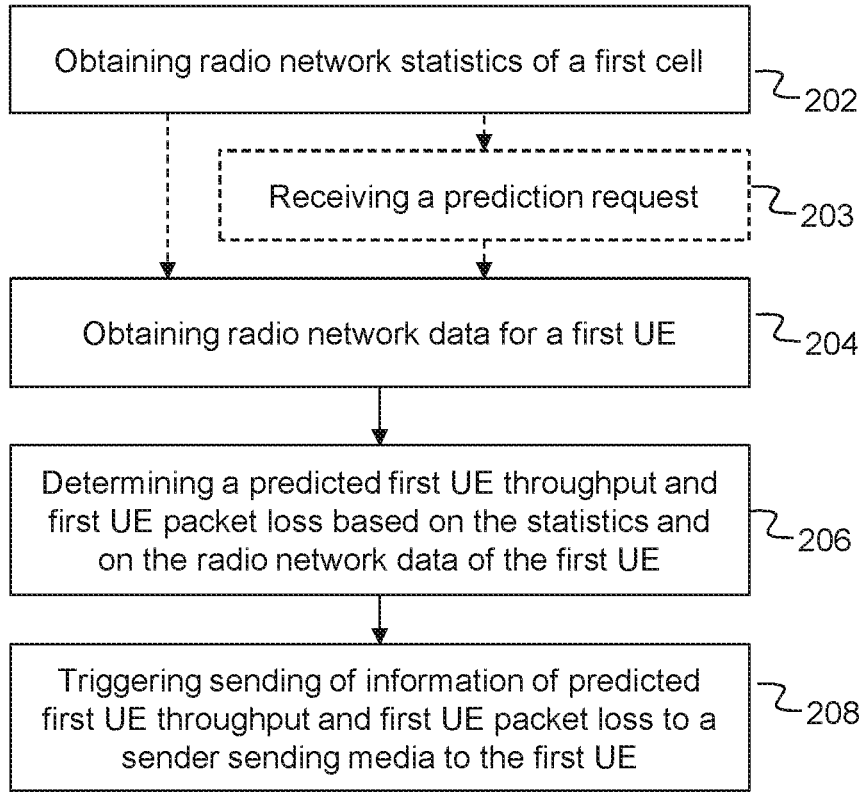
FIG. 4 is a flow chart illustrating methods performed by a system of a communication network, according to possible embodiments.

FIG. 4, in conjunction with FIG. 1, describes a method performed by a system of a wireless communication network 100 for determining transmission conditions for a real-time media flow to be transmitted wirelessly to a first UE 121 residing in a first cell 115 served by a first base station 110 of the network. The method comprises obtaining 202 radio network statistics of the first cell, the radio network statistics comprising radio network data for individual of a plurality of UEs in the first cell, UE throughput for individual of the plurality of UEs, and UE packet loss for individual of the plurality of UEs, and obtaining 204, at a second time point occurring later in time than the obtaining of the radio network statistics, radio network data for the first UE. The method further comprises determining 206 a predicted first UE throughput and a predicted first UE packet loss based on the obtained radio network statistics of the first cell and on the obtained radio network data for the first UE, and triggering sending 208 information of the predicted first UE throughput and of the predicted first UE packet loss to a sender of the real-time media flow to the first UE.

The radio network statistics for one of the plurality of UEs in the first cell may be collected at the same time point so that one statistics sample comprises radio network data, UE throughput and UE packet loss for the one UE at approximately the same time point. The radio network statistics may be stored in a database. A "packet loss" may in this method include packets being late with more than a defined time period, e.g. 200 ms. When determining predicted first UE throughput and predicted first UE packet loss, the obtained radio network data for the first UE is compared to earlier obtained radio network statistics for a plurality of UEs that have been in the cell earlier. The actual packet loss and the throughput that these earlier UEs had are then used as a prediction for the first UE throughput and packet loss. For example, based on the obtained radio network data for the first UE, the method looks into a statistics database with the obtained radio network statistics and analyses what was the actual packet loss and throughput for earlier UEs with similar radio network data as the first UE. The method then predicts the packet loss and throughput for the first UE as being similar to the packet loss and throughput that earlier UEs experienced that had similar radio network data that the first UE has. The determining of a predicted first UE throughput and a predicted first UE packet loss based on the obtained radio network statistics and on the obtained radio network data for the first UE may be performed by a computer-based algorithm/method such as a formula-based method or a machine learning method. Such algorithms/methods learn from the obtained radio network statistics and gain some intelligence from it, e.g. builds up a decision tree model from the statistics, and uses the gained intelligence, e.g. the decision tree model, to decide the predicted first UE throughput and first UE packet loss. More details of machine learning methods are described further down in this document. The real-time media may be real-time video. The sender of the video may be for example a video application server 150 of FIG. 2 or another UE, such as the second UE 122 of FIG. 1.

By using statistics data for earlier UEs in such a way as in the embodiment of FIG. 4, a good estimate of first UE throughput and first UE packet loss can be achieved. As the sender of the media flow to the first UE is provided with information of the predicted first UE throughput and of the predicted first UE packet loss determined in this way, the sender can select real-time media sending rate and error correction according to the predicted first UE throughput and the predicted first UE packet loss when sending real-time media to the first UE. As a result, the real-time media that is sent to the first UE is sent with a sending rate and error correction that is suitable for the first UE with the radio network conditions that the first UE experiences for the moment. The sender hereby gets an indication from the network about predicted throughput and packet loss that is applicable now and in a near future. This information can be obtained even before start of a real-time media streaming session. Thereby, this is a much faster way of getting information of throughput and packet loss than current receiver based packet loss and rate feedback methods. In addition, this information is more up to date and also more accurate as it is a prediction for the future using network information rather than statistics from the past on an end host only. As a result, such a method would provide a good QoE to the end-users.

The system that performs the method may be a base station of the wireless communication network, such as the first base station 110. The first base station may then measure radio network data, as well as UE throughput and UE packet loss, itself, or receive measurements wirelessly from the plurality of UEs and from the first UE. Alternatively, the system that performs the method may be any other network node of the communication system, such as a node further away from the UEs, e.g. a node in the core network or a node in the radio access network, such as another base station, a radio network controller, RNC, an MME etc. In this alternative, the first base station communicates the power measurements to the network node performing the method. Alternatively, the system that performs the method may be a group of network nodes, wherein functionality for performing the method are spread out over different physical, or virtual, nodes of the network. The latter may be called a "cloud-solution.

According to an embodiment, the radio network data for individual of a plurality of UEs in the first cell comprises one or more of the following: a number of radio quality indications for individual of the plurality of UEs in the first cell, load of the first cell, a number of cell configuration parameters indicating packet loss for individual of the plurality of UEs. When the radio network statistics for one and the same of the plurality of UEs is collected at the same time point, one statistics sample for one UE comprises radio quality indications and/or cell configuration parameters taken at approximately the same time point as UE throughput and UE packet loss for the same UE. Further, the load of the first cell is also taken at approximately the same time point for the same statistics sample.

According to an embodiment, the radio network data for the first UE comprises one or more of the following: a number of radio quality indications for the first UE at the second time point, load of the first cell at the second time point, a number of cell configuration parameters indicating packet loss for the first UE at the second time point.

According to another embodiment, as shown in FIG. 4, the system obtains 202 the radio network statistics for individual of the plurality of UEs over a plurality of different time periods, and wherein the radio network data for the first UE is obtained 204 over a defined first time period, and wherein the determining 206 of the predicted first UE throughput and the predicted first UE packet loss is further based on the plurality of different time periods and on the first time period. In other words, when determining the predicted first UE packet loss and throughput, radio network statistics are taken into a higher account when a time period of the plurality of time periods has been used that is closer to the first time period than when a time period has been used that is further away from the first time period. Hereby, the prediction of first UE packet loss and throughput may be made also taking the time period for when the predictions are to be valid into consideration. As a result, a better prediction can be made. The determining of predicted first UE throughput and first UE packet loss also taking the obtaining time period into account may preferably be made by a data algorithm, such as a machine learning method/algorithm.

Figure 5:
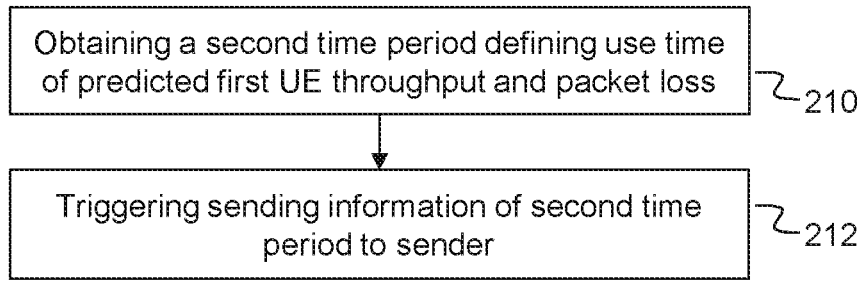
FIG. 5 is another flow chart of a possible method performed by a system of a communication network.

According to another embodiment, as shown in FIG. 5, the method further comprises obtaining 210 a second time period defining how long time to use the predicted first UE throughput and the predicted first UE packet loss and triggering sending 212 information of the second time period to the sender. Such a second time period is used to inform the sender for how long time the predictions of first UE throughput and packet loss are valid so that the sender can select video rate and error correction redundancy rate that is kept for a certain time indicated by the second time period. As frequent video rate changes might not be good for a QoE perspective, a UE might want to have a certain rate fixed for a certain time period, for instance 1 sec, 5 sec, 10 sec, 1 min etc. depending on the UE or content provider's requirements. The second time period may be a constant for the communication network. Alternatively, the second time period may be input data obtained from the first UE. Alternatively, the second time period may be determined based on the first time period and the plurality of time periods when predicting the first UE throughput and the first UE packet loss. The steps 210 and 212 may be performed at any time during performance of the method.

According to another embodiment, as shown in FIG. 4, the method may further comprise receiving 203 a prediction request for predicting packet loss and throughput for the first UE. Further, the obtaining 204 of radio network data for the first UE and the determining 206 of the predicted first UE throughput and the predicted first UE packet loss is performed in response to the received prediction request. Thereby, it is possible to only use the claimed method when it is needed, thus saving processing and communication resources. The prediction request may be sent from the first UE or from the sender of the real-time data.

According to another embodiment, as shown in FIG. 4, two or more different pairs of predicted first UE throughput and first UE packet loss are determined 206, and wherein information of the two or more pairs are triggered to be sent 208 to the sender. By receiving two or more different pairs of predicted first UE throughput and first UE packet loss, the sender may select which of the pairs of predicted first UE throughput and first UE packet loss to base its selection of sending media rate and error correction on. For example, if a media rate is to be used that is lower than the predicted UE throughput of a first pair, the sender may select the predicted UE throughput of another pair, which is lower than the throughput of the first pair, and its associated predicted packet loss when determining which error correction to use. Together with the pairs of the first UE throughput and first UE packet loss may also be associated individual time periods defining for how long time each pair should be used.

Figure 6:
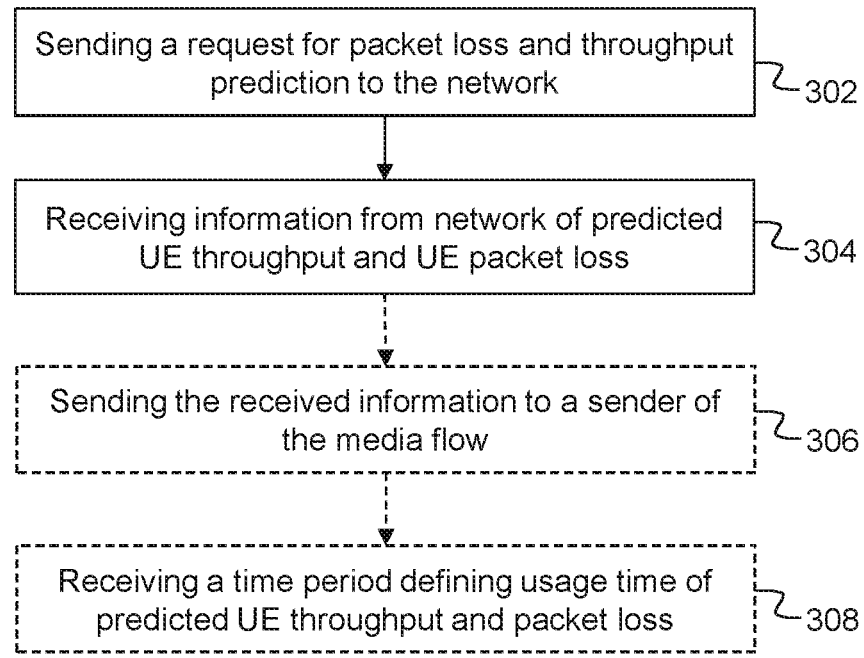
FIG. 6 is a flow chart illustrating methods performed by a UE, according to possible embodiments.

FIG. 6, in conjunction with FIG. 1, describes an embodiment of a method performed by a UE 121 wirelessly connected to a wireless communication network 100 for facilitating transmission of a real-time media flow from a sender towards the UE. The method comprises sending 302 a request to the network, requesting a packet loss prediction and a throughput prediction for transmission of a real-time media flow from the network towards the UE, and receiving 304, from the network, information of a predicted UE throughput and a predicted UE packet loss predicted by the network in response to the sent 302 request. The UE may then send the received information from the network further to the sender of the media flow for the sender to make a selection of an appropriate data rate and error correction for the real-time media flow based on the information of predicted UE throughput and packet loss. As an alternative, the UE may make the selection and send the selected data rate and error correction to the sender of the real-time media flow.

According to an embodiment, as also is shown in FIG. 6, the method may further comprise sending 306 the received information to the sender of the real-time media flow, the real-time media flow to be sent from the sender to the UE. The sender may then use the received information of the predicted UE throughput and the predicted UE packet loss to select an appropriate data rate and error correction.

According to another embodiment shown in FIG. 6, the method may further comprise receiving 308, from the network, information of a time period defining how long time to use the predicted UE throughput and the predicted UE packet loss. This information may be sent further to the sender of the media flow that uses it to decide data rate and error correction for the defined time period for the media stream. Alternatively or in addition, the information of time period may be used at the UE.

Figure 7:
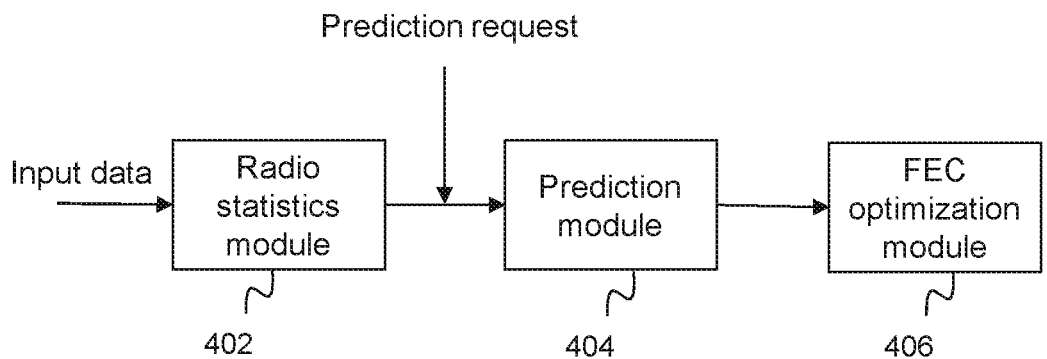
FIG. 7 is a schematic block diagram of a system according to possible embodiments.

In the following, another embodiment of the present invention is described. FIG. 7 shows a possible logical architecture of the system of this embodiment. The system comprises a radio statistics module 402 that obtains radio network statistics data from the communication network, the radio network statistics data comprising radio network data for individual UEs in different cells of the network including UE throughput and UE packet loss for the individual UEs. The radio statistics module 402 collects and stores the radio network statistics, wherein radio network data collected for one UE at one time point may be stored as one data post. The system further comprises a prediction module 404 that predicts packet loss and throughput for individual UEs at a later time point, based on the collected radio network statistics data. The prediction module 404 is connected to the radio statistics module 402. The prediction module 404 may wait for a prediction request from a first UE that is to receive or send wirelessly real-time video or from a real-time media provider until it predicts packet loss and throughput for transmission of real-time video from/to the first UE. In the prediction request, the first UE/content provider may optionally provide the prediction module 404 with a time period the time for which the prediction is to be used. Once activated, the prediction module 404 predicts future throughput and packet loss rate for the first UE based on the output from radio statistics module 402. The output of the prediction module 404 includes the predicted UE throughput and UE packet loss and possibly also the time period, either provided by the UE/content provider, or by the prediction module itself. The system further comprises an adaptive FEC optimization module 406 connected to the prediction module 404. The FEC optimization module 406 takes the predicted UE packet loss rate, the predicted UE throughput and the time period received from the prediction module 404 as input, and adapts the amount of FEC redundancy packets according to the throughput and packet loss rate. Further, the adapted amount of FEC redundancy packets are then used by the sender of the video when transmitting the video.

In more detail, the radio statistics module 402 collects radio statistics including radio network data such as one or more of UE radio quality measures, load of the cell in which the UE resides and cell configuration parameters, as well as UE throughput and packet loss for individual UEs. This information is sent to the prediction module 404.

The UE radio quality measures may include one or more of Channel Quality Indicator, CQI, of the UE, received from a period where UE reporting for downlink estimation, antenna rank of the UE, Reference Signal Received Power, RSRP, values and Reference Signal Received Quality, RSRQ, values reported from the UE. The above UE radio quality measures indicate the spectrum efficiency when a certain frequency band is allocated for the UE, therefore, it provides a good indication for the UE throughput. In addition, the radio quality measures have an impact on Block Error Rate, BLER, which will result in different packet loss rate.

The cell load may be measured by one or more of the following: number of UEs in the cell, number of active UEs in the cell, number of used frequency sub-bands. The number of used frequency sub-bands indicates the total network capacity and the load indicates the share of individual UEs based on number of UEs in the cell. It provides a good indication for the UE throughput. Also, high cell load may cause interference among users, thus resulting in more packet loss.

The Cell configuration parameters may be one or more of the following: Target HARQ BLER, maximum number of ARQ retransmission attempts or maximum number of HARQ retransmission attempts. The mentioned cell configuration parameters provide a good indication about packet loss. In particular, a simplified formula can be provided. For example, if we assume target BLER is 10%, and maximum number of HARQ attempt is 3, and maximum number of ARQ attempt is 1, then the packet loss should be 0.1%. This means that every HARQ transmission has an average error rate of 10%, and we retransmit HARQ 3 times. So in average, the loss rate is 10%^3=0.1%. However, this computation may be too simple, due to the following reasons: First, in different radio conditions, HARQ error rate in every Transmission Time Interval, TTI, may vary from the target BLER. Second, HARQ errors could be highly correlated, so if the first transmission is erroneous, the second one could be erroneous with high probability, for example when a UE is in a tunnel for some seconds, all HARQ re-transmission will fail. Moreover, the systematic bits in the initial transmission of a HARQ process are more important than the parity bits in the retransmissions. Such correlation and dependency sometimes are depend on geographies and human behavior and are very hard to known using formulas, therefore, it is best to use a data driven machine learning based approach to tackle this.

UE throughput and packet losses. The UE throughput and packet loss are the ground truth which can be obtained from the radio statistics module. It is used for building a model, but not necessary for doing the prediction. The UE throughput can be collected by read cell counters. IP/UDP level packet losses are slightly harder to obtain, but it can be computed from ARQ and HARQ statistics. Finally, for real-time video, packets arriving too late are not useful as video has already been played out. Therefore, it should be considered as packet loss. Therefore, for example, we could consider all packets with RLC retransmission to be late and therefore lost.

The prediction module 404. The goal of the prediction module is to predict the potential packet loss rate as well as the UE's throughput in the next required time period based on the features received from the radio statistic module 402. To perform more efficient and accurate prediction, pre-learned models for different time scales should be constructed, and stored in a model database inside the prediction module.

Constructing the model. In our case, the input features for the prediction are from the radio network data, e.g. the UE radio quality, the cell load, and the cell configuration parameters, while the UE throughput and packet losses are the ground truth used for building the model. After running the system for a while, the prediction module could obtain data statistics samples as shown in Table 1 below, wherein each row is a data sample with values for one UE at one time point.

TABLE 1

Prediction samples

| CQI | RANK | RSRP | RSRQ | Nr of active UEs | Nr of used freq sub-bands | Target BLER | Max HARQ | Time period | Packet loss rate | Through-put |
|---|---|---|---|---|---|---|---|---|---|---|
| 5 | 1 | −100 | −10 | 30 | 100 | 10% | 4 | 5 s | 0.1% | 1 Mbs |
| 8 | 1 | −90 | −8 | 10 | 50 | 10% | 4 | 5 s | 0.05% | 1.35 Mbs |
| 10 | 2 | −80 | −4 | 15 | 100 | 10% | 6 | 10 s | 0.01% | 1.75 Mbs |
| 13 | 2 | −75 | −3 | 20 | 100 | 10% | 8 | 10 s | 0.08% | 1.2 Mbs |
| . |
| . |
| . |

Basically, what the radio statistics module does is at a random time collecting a sample with the UE radio qualities measures, cell load and configuration parameters, e.g. CQI, RANK, . . . to max HARQ, and then it waits the time specified by the time periods, and compute the percentage of lost packets (including late packets considered as lost) from the UE for this sample. When doing this, we obtain one sample as shown in one row of table 1. After running the system for while, the system may obtain a lot of samples. Thereafter, the radio statistics module sends the samples, i.e. the data of the lines of table 1 to the prediction module, and the prediction module uses the data for prediction of future UE packet loss and throughput, based on a model built on machine learning methods such as decision trees, random forest, neural networks, support vector machines, and deep learning. The system could build different models for different time periods, for example one model for using UE throughput and packet loss for 5 seconds, another model for 30 seconds, etc.

The models can be updated, either with online learning, or reconstructed from time to time. The mechanism collects current online data and either waits until enough data for each time scale class is available to build the model, or uses past historical data combined with more recent data in order to build the model, or a combination thereof. When the models are created offline, this is taken into account elsewhere.

Predicting packet loss and throughput using the model. After the models are created, the prediction module 404 can start to perform predictions. When receiving a packet loss prediction request from a party that is to transmit or receive real-time video, i.e. either from a sender or a receiver of video, wherein the receiver is a UE, the packet loss prediction module should select a pre-defined model based on the time period for prediction. If there is no exact match for the time period, the closest time period should be selected. After that, the prediction module 404 obtains the features regarding this particular first UE from the radio statistics module 402, and estimate the packet loss rate and UE throughput. Finally, the prediction results are sent to the FEC optimization module 406, together with the used time periods.

The output from the prediction module 404 includes a time period, a throughput value, and a packet loss rate. The time period is the duration of this prediction, i.e., how long is this prediction valid. The throughput is the maximum throughput that the can be provided to the first UE from the network. The packet loss rate is the rate the first UE will experience if the first UE receive in this maximum rate.

In addition to this, more predictions about packet loss rate at different throughput can be provided to the first UE. For example, the maximum throughput for the UE is 2 Mb/s, and packet loss rate is 1%. But if the first UE only receive at 1 Mb/s, the loss rate could be decrease to 0.7%. Therefore the prediction of 1 Mb/s together with 0.7% loss rate can also be sent to the first UE.

Finally, the prediction of packet loss here is only on the radio network side, i.e. from the radio network towards the first UE, while the end-to-end packet loss could be slightly higher. Although in general most of the packet loss occurs in radio. So the final FEC optimization module should use radio loss prediction to obtain an end-to-end packet loss prediction.

Figure 8:
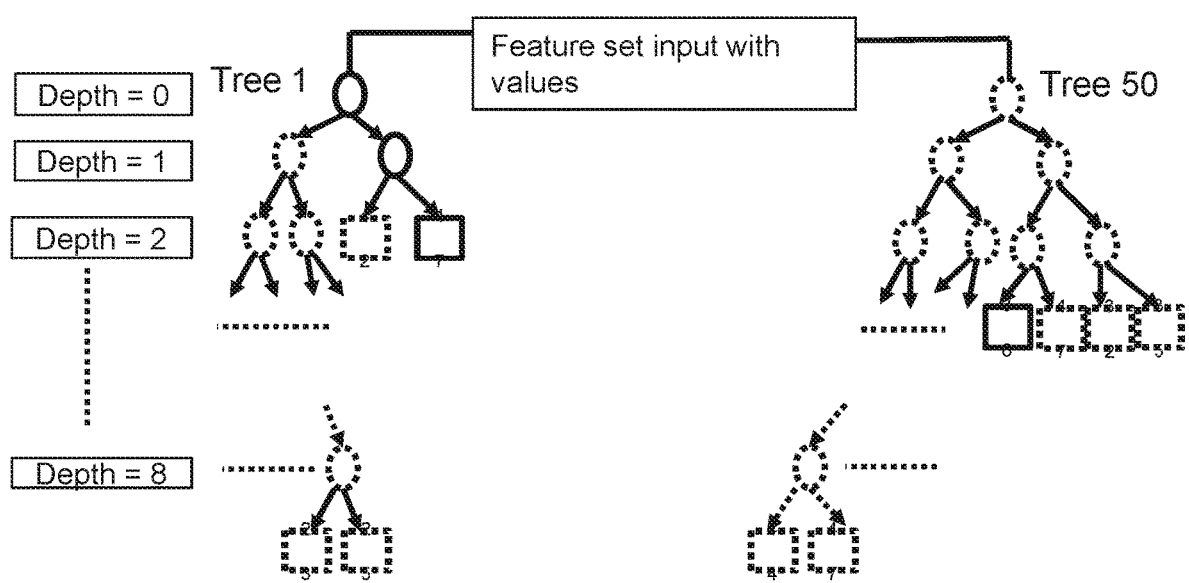
FIG. 8 is a tree structure flow chart of an exemplary random forest model that may be used in possible embodiments.

Machine learning prediction models. A machine learning model tries to take samples with features and ground truth, i.e. predicted outcome, and generate a model to predict future samples with features. There are a variety of different models, with different technologies, such as decision trees, random forest, neural networks, support vector machines, and deep learning. A simple model for prediction is decision trees. For random forest, the model tries to generate a number of decision trees based on the training data and then use these trees for future prediction. When doing the prediction, at each node in a tree, there is a condition check whether the value of a certain feature (among all features) is smaller than the specified value of the tree node. If the answer to the condition check is YES, the model proceeds to the left child node. Otherwise, it proceeds to the right child node. The model recursively goes through all the levels in a tree, until it reaches to the leaf node of the tree, where it gets a predicted estimate. The above process is performed for all the trees, which can be done in parallel for all the trees. Finally, there are a number of estimates obtained from the corresponding trees. The average of these estimates is used as final prediction value. FIG. 8 illustrates an example of such a random forest model.

The Adaptive FEC optimization module 406. For video applications nowadays, a video frame typically needs to be fragmented into a number of packets, because the size of the video frame is generally larger than the network's maximum transmission unit, MTU. In a typical application, a video image will need to be transmitted in around five to thirty packets. Depending on the video codec, one packet that gets lost may result in either a whole frame or a whole slice being not decodable. Thus, even a relatively low packet loss rate can cause significant visual quality degradation. To solve this, in some video applications, FEC code has been used to add redundant packets, which can be used by the receiver to detect and recover lost packets.

In general, a FEC algorithm works in this way: the sender of the video packets takes a group of N data packets that need to be protected and applies the exclusive OR, XOR, operation over the headers and the data payload of the packets. Any packet that is smaller than the largest packet in the group may need to be padded to achieve the same length as the largest packet in the group. This operation generates a FEC packet which is sent to the receiver together with the data packets. If any of the N data packets gets lost or does not arrive in time, the receiver can use the N−1 received data packets and the FEC redundant packet to recover the lost packet by reversing the FEC packet generating process.

There is a considerable number of papers that detail different adaptive FEC-code algorithms. For instance, Uneven Level Protection, ULP; FEC uses different levels of FEC protection for video data, since data in many video coding formats are arranged in the order of more important data to less important data. Another FEC method is a flexible FEC that proposes three different ways of generating FEC packets:

1. 1-D non-interleaved FEC: Apply XOR operation to every N consecutive source packets. It performs better when the packet loss is random.
2. 1-D interleaved FEC: Apply XOR operation to the group of the source packets whose sequence number are N apart from each other. It performs better when the packet loss is in burst.
3. 2-D parity FEC: Combines 1 and 2. More protection but also consumes more network bandwidth.

All of those different implementations of FEC mostly rely on a good knowledge of packet loss rate of the network channel. The FEC algorithms adapt themselves by changing the rate of the FEC-encoded redundant packets based on the current packet loss rate of the channel. The better knowledge of the packet loss rate you can get, the better balance between bandwidth usage and playable real time video data can be achieved.

In an exemplary current network, about 90% packet losses occur in a wireless channel, so the packet loss rate prediction from the network can closely represent the end-to-end packet loss. In practice, the UE could add a few more packet loss percentage to compensate for the packet loss in the other parts of the network.

For each FEC algorithm, a specific FEC redundancy rate will be able to be set at real-time based on a given specific packet loss rate prediction, network throughput, video format and/or FEC-decoding-failure-rate etc. Since a FEC algorithm is not part of this invention, it will not be discussed in a full detail here. Generally speaking, when the packet loss rate increases or decreases, this FEC optimization module will accordingly include more or less redundancy packets in the data stream, to best utilize network bandwidth. For instance, assume the predicted packet loss rate is 10% and UE throughput is 1 Mbps, the FEC optimization module may decide to use 800 kbps for the data packets, and 200 kbps for the FEC redundancy packets. When the packet loss rate is increased to 15% and UE throughput comes up to 1.5 Mbps, the FEC optimization module may decide to increase the percentage of redundancy packets (e.g. to 500 kbps) and use less percentage of the bandwidth (e.g. 1 Mbps) for the data packets.

Figure 9:
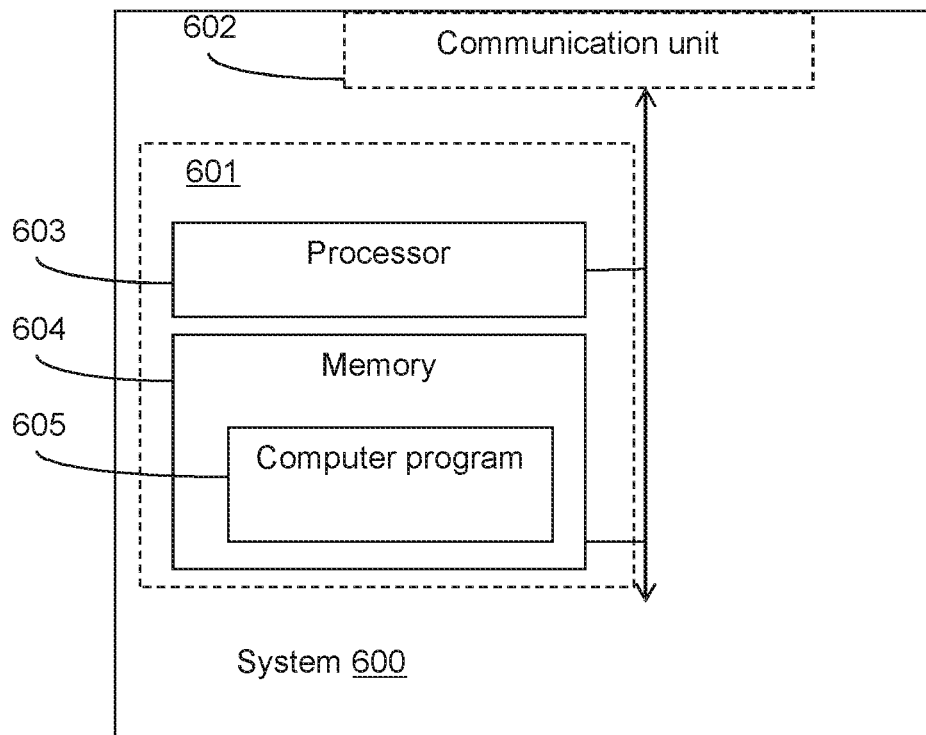
FIGS. 9-10 are block diagrams illustrating a system of the communication network in more detail, according to further possible embodiments.

FIG. 9, in conjunction with FIG. 1, shows a system 600 operable in a wireless communication network 100, configured for determining transmission conditions for a real-time media flow to be transmitted wirelessly to a first UE 121 residing in a first cell 115 served by a first base station 110 of the network. The system 600 comprises a processor 603 and a memory 604. The memory contains instructions executable by said processor, whereby the system 600 is operative for obtaining radio network statistics of the first cell, the radio network statistics comprising radio network data for individual of a plurality of UEs in the first cell, UE throughput for individual of the plurality of UEs, and UE packet loss for individual of the plurality of UEs. The system 600 is further operative for obtaining, at a second time point occurring later in time than the obtaining of the radio network statistics, radio network data for the first UE, determining a predicted first UE throughput and a predicted first UE packet loss based on the obtained radio network statistics of the first cell and on the obtained radio network data for the first UE, and triggering sending of information of the predicted first UE throughput and of the predicted first UE packet loss to a sender of the real-time media flow to the first UE.

The system may be a base station of the wireless communication network, such as the first base station 110. The first base station may then be operative for measuring radio network data, as well as UE throughput and UE packet loss, itself, or for receiving measurements wirelessly from the plurality of UEs and from the first UE. Alternatively, the system may be any other network node of the communication system, such as a node further away from the UEs, e.g. a node in the core network or a node in the radio access network, such as another base station, a radio network controller, RNC, an MME etc. In this alternative, the first base station is operative to communicate the power measurements to the network node that has the system. Alternatively, the system may be a group of network nodes, wherein functionality of the system is spread out over different physical, or virtual, nodes of the network. The latter may be called a "cloud-solution.

According to an embodiment, the system is operable for obtaining the radio network statistics for individual of the plurality of UEs over a plurality of different time periods, and the system is operable for obtaining the radio network data for the first UE over a defined first time period. The system is further operable for determining the predicted first UE throughput and the predicted first UE packet loss further based on the plurality of different time periods and on the first time period.

According to another embodiment, the system is further operable for obtaining a second time period defining how long time to use the predicted first UE throughput and the predicted first UE packet loss and for triggering sending of information of the second time period to the sender.

According to another embodiment, the system is further operable for receiving a prediction request for predicting packet loss and throughput for the first UE, and the system is operable for performing the obtaining of radio network data for the first UE and the determining of the predicted first UE throughput and the predicted first UE packet loss in response to the received prediction request.

According to another embodiment, the system is operable for determining two or more different pairs of predicted first UE throughput and first UE packet loss. The system is further operable for triggering to send information of the two or more pairs to the sender.

According to other embodiments, the system 600 may further comprise a communication unit 602, which may be considered to comprise conventional means for communicating from and/or to other nodes in the network 100, such as the first and second base stations 110, 112, UEs 121, 122, MME 130 etc. The communication unit 602 may comprise one or more communication ports for communicating with the other nodes in the network, or, in case the system is a base station, transceivers for transmitting and receiving wireless signals from/to UEs. The instructions executable by said processor 603 may be arranged as a computer program 605 stored e.g. in said memory 604. The processor 603 and the memory 604 may be arranged in a sub-arrangement 601.

The sub-arrangement 601 may be a micro-processor and adequate software and storage therefore, a Programmable Logic Device, PLD, or other electronic component(s)/processing circuit(s) configured to perform the actions and/or methods mentioned above.

Figure 10:
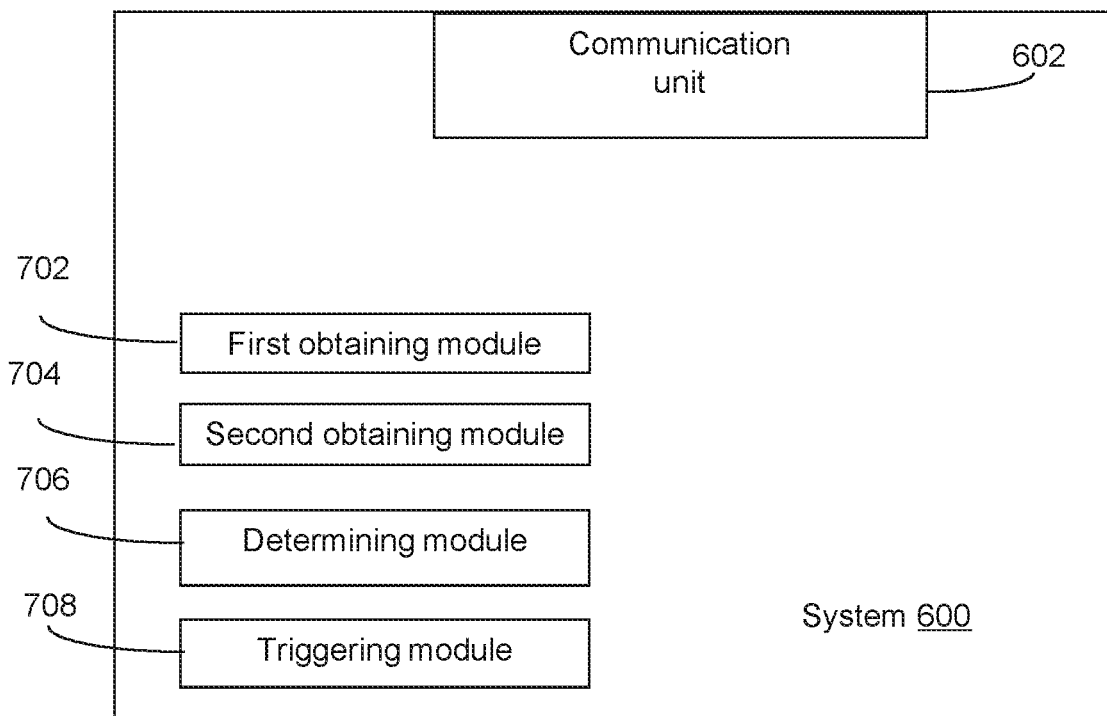

FIG. 10, in conjunction with FIG. 1, describes another embodiment of a system 600 operable in a wireless communication network 100, configured for determining transmission conditions for a real-time media flow to be transmitted wirelessly to a first UE 121 residing in a first cell 115 served by a first base station 110 of the network. The system 600 comprises a first obtaining module 702 for obtaining radio network statistics of the first cell, the radio network statistics comprising radio network data for individual of a plurality of UEs in the first cell, UE throughput for individual of the plurality of UEs, and UE packet loss for individual of the plurality of UEs, and a second obtaining module 704 for obtaining, at a second time point occurring later in time than the obtaining of the radio network statistics, radio network data for the first UE. The system 600 further comprises a determining module 706 for determining a predicted first UE throughput and a predicted first UE packet loss based on the obtained radio network statistics of the first cell and on the obtained radio network data for the first UE, and a triggering module 708 for triggering sending of information of the predicted first UE throughput and of the predicted first UE packet loss to a sender of the real-time media flow to the first UE. The system 600 may further comprise a communication unit 602 similar to the communication unit of FIG. 9.

Figure 11:
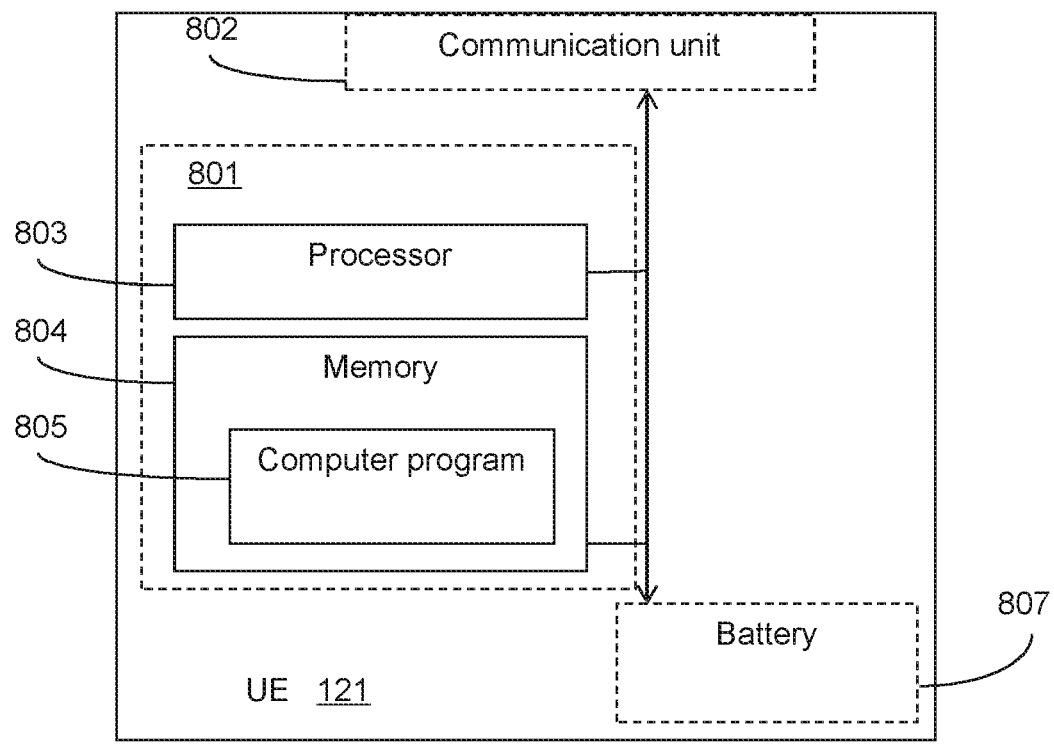
FIGS. 11-12 are block diagrams illustrating a UE in more detail, according to further possible embodiments.

FIG. 11, in conjunction with FIG. 1, describes a UE 121 operable to be wirelessly connected to a wireless communication network 100 for facilitating transmission of a real-time media flow from a sender towards the UE. The UE 121 comprises a processor 803 and a memory 804. The memory contains instructions executable by said processor, whereby the UE 121 is operative for sending a request to the network, requesting a packet loss prediction and a throughput prediction for transmission of a real-time media flow from the network towards the UE, and receiving, from the network, information of a predicted UE throughput and a predicted UE packet loss predicted by the network in response to the sent request.

According to an embodiment, the UE is further operative for sending the received information to the sender of the real-time media flow to the UE.

According to another embodiment, the UE is further operative for receiving, from the network, information of a time period defining how long time to use the predicted UE throughput and the predicted UE packet loss.

According to other embodiments, the UE 121 may further comprise a communication unit 802, which may be considered to comprise conventional means for communicating from and/or to other nodes in the network 100, such as the first and second base stations. The communication unit 802 may comprise one or more transceivers for transmitting and receiving wireless signals to/from the base stations. The instructions executable by said processor 803 may be arranged as a computer program 805 stored in said memory 804. The processor 803 and the memory 804 may be arranged in a sub-arrangement 801. The sub-arrangement 801 may be a micro-processor and adequate software and storage therefore, a Programmable Logic Device, PLD, or other electronic component(s)/processing circuit(s) configured to perform the actions and/or methods mentioned above. The UE may further comprise a power supply such as a battery 807 for supplying the first UE with electrical power.

Figure 12:
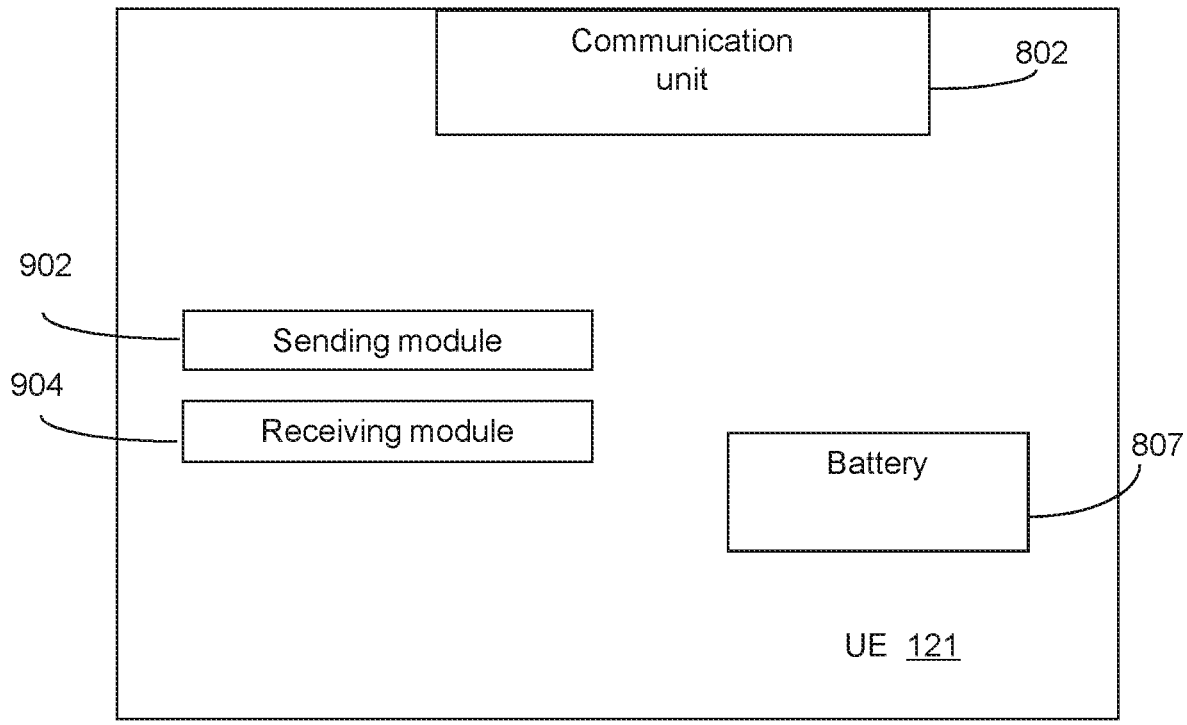

FIG. 12, in conjunction with FIG. 1, shows another embodiment of a UE 121 operable to be wirelessly connected to a wireless communication network 100 for facilitating transmission of a real-time media flow from the network towards the UE. The UE 121 comprises a sending module 902 for sending a request to the network, requesting a packet loss prediction and a throughput prediction for transmission of a real-time media flow from the network towards the UE, and a receiving module 904 for receiving, from the network, information of a predicted UE throughput and a predicted UE packet loss predicted by the network in response to the sent request. The UE 121 may further comprise a communication unit 802 and a battery 807 similar to the communication unit and battery of FIG. 11.

The computer programs 605 and 805 may respectively comprise computer readable code means, which when run in the system 600/the UE 121 causes the system/the UE to perform the steps described in any of the described embodiments of the respective system/UE. The respective computer program 605; 805 may be carried by a computer program product connectable to the respective processor 603; 803. The computer program product may be the memory 604; 804. The memory 604; 804 may be realized as for example a RAM (Random-access memory), ROM (Read-Only Memory) or an EEPROM (Electrical Erasable Programmable ROM). Further, the computer program may be carried by a separate computer-readable medium, such as a CD, DVD or flash memory, from which the respective program could be downloaded into the respective memory 604; 804. Alternatively, the respective computer program may be stored on a server or any other entity connected to the communication network to which the system/UE has access via the communication unit 602; 802 of the respective system and UE. The computer program may then be downloaded from the server into the memory 604; 804.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby. In the exemplary figures, a broken line generally means that what is within the broken line is optional.

The invention claimed is:

1. A method performed by a system of a wireless communication network for determining transmission conditions for a real-time media flow to be transmitted wirelessly to a first User Equipment, UE, residing in a first cell served by a first base station of the network, the method comprising:

obtaining radio network statistics of the first cell at a first time point, the radio network statistics comprising radio network data for each individual UE of a plurality of UEs in the first cell, UE throughput for each individual UE of the plurality of UEs, and UE packet loss for each individual UE of the plurality of UEs;

obtaining, at a second time point occurring later in time than the obtaining of the radio network statistics at the first time point, additional radio network data for the first UE, determining a predicted first UE throughput and a predicted first UE packet loss based on the obtained radio network statistics of the first cell and on the obtained additional radio network data for the first UE, and triggering sending of information of the predicted first UE throughput and of the predicted first UE packet loss to a sender of the real-time media flow to the first UE.

2. The method according to claim 1, wherein the radio network data for individual of a plurality of UEs in the first cell comprises one or more of the following: a number of radio quality indications for individual of the plurality of UEs in the first cell, load of the first cell, a number of cell configuration parameters indicating packet loss for individual of the plurality of UEs.

3. The method according to claim 1, wherein the additional radio network data for the first UE comprises one or more of the following: a number of radio quality indications for the first UE at the second time point, load of the first cell at the second time point, a number of cell configuration parameters indicating packet loss for the first UE at the second time point.

4. The method according to claim 1, wherein the system obtains the radio network statistics for each individual UE of the plurality of UEs over a plurality of different time periods, and wherein the additional radio network data for the first UE is obtained over a defined first time period, and wherein the determining of the predicted first UE throughput and the predicted first UE packet loss is further based on the plurality of different time periods and on the first time period.

5. The method according to claim 1, further comprising obtaining a second time period defining how long time to use the predicted first UE throughput and the predicted first UE packet loss and triggering sending information of the second time period to the sender.

6. The method according to claim 1, further comprising receiving a prediction request for predicting packet loss and throughput for the first UE, and wherein the obtaining of additional radio network data for the first UE and the determining of the predicted first UE throughput and the predicted first UE packet loss is performed in response to the received prediction request.

7. The method according to claim 1, wherein two or more different pairs of predicted first UE throughput and first UE packet loss are determined, and wherein information of the two or more pairs are triggered to be sent to the sender.

8. A system operable in a wireless communication network, configured for determining transmission conditions for a real-time media flow to be transmitted wirelessly to a first UE residing in a first cell served by a first base station of the network, the system comprising a processor and a memory, said memory containing instructions executable by said processor, whereby the system is operative for:

obtaining radio network statistics of the first cell at a first time point, the radio network statistics comprising radio network data for each individual UE of a plurality of UEs in the first cell, UE throughput for each individual UE of the plurality of UEs, and UE packet loss for each individual UE of the plurality of UEs;

obtaining, at a second time point occurring later in time than the obtaining of the radio network statistics at the first time point, additional radio network data for the first UE, determining a predicted first UE throughput and a predicted first UE packet loss based on the obtained radio network statistics of the first cell and on the obtained additional radio network data for the first UE, and triggering sending of information of the predicted first UE throughput and of the predicted first UE packet loss to a sender of the real-time media flow to the first UE.

9. The system according to claim 8, wherein the system is operable for obtaining the radio network statistics for each individual UE of the plurality of UEs over a plurality of different time periods, and wherein the system is operable for obtaining the additional radio network data for the first UE over a defined first time period, and wherein the system is operable for determining the predicted first UE throughput and the predicted first UE packet loss further based on the plurality of different time periods and on the first time period.

10. The system according to claim 8, wherein the system is further operable for obtaining a second time period defining how long time to use the predicted first UE throughput and the predicted first UE packet loss and for triggering sending of information of the second time period to the sender.

11. The system according to claim 8, wherein the system is further operable for receiving a prediction request for predicting packet loss and throughput for the first UE, and wherein the system is operable for performing the obtaining of the additional radio network data for the first UE and the determining of the predicted first UE throughput and the predicted first UE packet loss in response to the received prediction request.

12. The system according to claim 8, wherein the system is operable for determining two or more different pairs of predicted first UE throughput and first UE packet loss, and wherein the system is operable for triggering to send information of the two or more pairs to the sender.

13. A computer program product comprised on a memory of a system of a wireless communication network configured to determine transmission conditions for a real-time media flow to be transmitted wirelessly to a first User Equipment (UE) residing in a first cell served by a first base station of the network, the computer program product comprising executable instructions that when executed by the system causes the system to perform operations comprising:

obtaining radio network statistics of the first cell at a first time point, the radio network statistics comprising radio network data for each individual UE of a plurality of UEs in the first cell, UE throughput for each individual UE of the plurality of UEs, and UE packet loss for each individual UE of the plurality of UEs, obtaining, at a second time point occurring later in time than the obtaining of the radio network statistics at the first time point, additional radio network data for the first UE, determining a predicted first UE throughput and a predicted first UE packet loss based on the obtained radio network statistics of the first cell and on the obtained additional radio network data for the first UE, and triggering sending of information of the predicted first UE throughput and of the predicted first UE packet loss to a sender of the real-time media flow to the first UE.

* * * * *